(12) United States Patent
Lee et al.

(10) Patent No.: US 10,658,605 B2
(45) Date of Patent: May 19, 2020

(54) LIGHT EMITTING ASSEMBLY AND DISPLAY DEVICE

(71) Applicant: Samsung Display Co., LTD., Yongin-si, Gyeonggi-Do (KR)

(72) Inventors: Seung-Jun Lee, Hwaseong-si (KR); Geunjeong Park, Hwaseong-si (KR); Hui Nam, Yongin-si (KR); Myungho Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 51 days.

(21) Appl. No.: 15/895,722

(22) Filed: Feb. 13, 2018

(65) Prior Publication Data
US 2019/0081261 A1    Mar. 14, 2019

(30) Foreign Application Priority Data
Sep. 11, 2017    (KR) .................. 10-2017-0116142

(51) Int. Cl.
*H01L 51/50* (2006.01)
*H01L 27/32* (2006.01)
(Continued)

(52) U.S. Cl.
CPC ............ *H01L 51/502* (2013.01); *C09K 11/08* (2013.01); *G09G 3/3233* (2013.01);
(Continued)

(58) Field of Classification Search
CPC . H01L 51/502; H01L 27/153; H01L 27/3258; H01L 33/08; H01L 2251/5353;
(Continued)

(56) References Cited

U.S. PATENT DOCUMENTS

2002/0030647 A1*  3/2002  Hack ................... G09G 3/3233
                                                                345/82
2005/0285822 A1* 12/2005  Reddy ................ G06F 3/03542
                                                                345/76
(Continued)

FOREIGN PATENT DOCUMENTS

KR        10-0248077        3/2000
KR        10-1655329        9/2016
KR     10-2016-0132656     11/2016

*Primary Examiner* — Dzung Tran
(74) *Attorney, Agent, or Firm* — Lewis Roca Rothgerber Christie LLP

(57) ABSTRACT

A quantum-nano light emitting diode (Q-NED) pixel includes a switching transistor configured to transfer a data voltage in response to a scan signal, a storage capacitor configured to store the data voltage transferred by the switching transistor, a driving transistor coupled to a first power supply voltage line, and configured to generate a driving current based on the data voltage stored in the storage capacitor, a plurality of Q-NEDs configured to emit light based on the driving current, the Q-NEDs having an ohmic contact resistance at anodes and cathodes of the Q-NEDs, a first sensing transistor configured to couple the Q-NEDs to a sensing line in response to a sensing signal when a sensing operation for sensing the ohmic contact resistance of the Q-NEDs is performed, and a second sensing transistor configured to decouple the Q-NEDs from a second power supply line in response to an inverted sensing signal.

19 Claims, 7 Drawing Sheets

(51) Int. Cl.
*H01L 27/15* (2006.01)
*H01L 33/08* (2010.01)
*C09K 11/08* (2006.01)
*G09G 3/3233* (2016.01)
*H01L 25/075* (2006.01)
*B82Y 40/00* (2011.01)
*B82Y 20/00* (2011.01)
*G09G 3/3291* (2016.01)
*H01L 33/32* (2010.01)
*H01L 33/20* (2010.01)

(52) U.S. Cl.
CPC ........ *H01L 25/0753* (2013.01); *H01L 27/153* (2013.01); *H01L 27/3258* (2013.01); *H01L 33/08* (2013.01); *B82Y 20/00* (2013.01); *B82Y 40/00* (2013.01); *G09G 3/3291* (2013.01); *G09G 2300/0819* (2013.01); *G09G 2300/0842* (2013.01); *G09G 2320/0295* (2013.01); *H01L 33/20* (2013.01); *H01L 33/32* (2013.01); *H01L 2251/5353* (2013.01)

(58) Field of Classification Search
CPC ...... C09K 11/08; G09G 3/3233; B82Y 20/00; B82Y 40/00
USPC .......................................................... 257/88
See application file for complete search history.

(56) References Cited

U.S. PATENT DOCUMENTS

| | | | | |
|---|---|---|---|---|
| 2007/0075939 | A1* | 4/2007 | Cho | G09G 3/3233 345/76 |
| 2008/0048951 | A1* | 2/2008 | Naugler, Jr. | G09G 3/006 345/82 |
| 2008/0315788 | A1* | 12/2008 | Levey | G09G 3/3233 315/291 |
| 2010/0123649 | A1* | 5/2010 | Hamer | G09G 3/3225 345/76 |
| 2013/0050292 | A1* | 2/2013 | Mizukoshi | G09G 3/3291 345/690 |
| 2014/0103289 | A1* | 4/2014 | Liao | H01L 21/0237 257/13 |

* cited by examiner

FIG. 7

PIXEL OHMIC MAP　　245

| (R11/RREF) C11 | (R12/RREF) C12 | ... | (R1m/RREF) C1m |
|---|---|---|---|
| (R21/RREF) C21 | ... | ... | ... |
| ... | ... | ... | ... |
| (Rn1/RREF) Cn1 | (Rn2/RREF) Cn2 | ... | (Rnm/RREF) Cnm |

LIGHT EMITTING ASSEMBLY AND DISPLAY DEVICE

CROSS-REFERENCE TO RELATED APPLICATION(S)

This application claims priority to and the benefit of Korean Patent Application No. 10-2017-0116142, filed on Sep. 11, 2017 in the Korean Intellectual Property Office (KIPO), the entire contents of which are incorporated herein by reference.

BACKGROUND

1. Field

Exemplary embodiments of the present disclosure relate to display devices, and, for example, to emitting assemblies and display devices.

2. Description of the Related Art

An organic light emitting diode (OLED) display device includes OLEDs has been widely used. However, as a driving time for the OLED is accumulated, the OLED made of an organic material may be degraded, light emission efficiency may be reduced, and thus the OLED may have a limited lifespan. As a result, a Q-NED display device is being developed which includes Q-NEDs made of an inorganic material. The Q-NED may maintain its luminance over time, and thus a lifespan of the Q-NED may not be limited.

SUMMARY

Some example embodiments provide a light emitting assembly capable of compensating for an ohmic contact resistance deviation between light emitting elements.

Some example embodiments provide a display device capable of compensating for an ohmic contact resistance deviation between light emitting elements.

According to example embodiments, there is provided a light emitting assembly including a plurality of pixels, wherein each of the pixels includes: a switching transistor that transfers a data voltage in response to a scan signal, a storage capacitor that stores the data voltage transferred by the switching transistor, a driving transistor coupled to a first power supply voltage line, and that generates a driving current based on the data voltage stored in the storage capacitor, a plurality of light emitting elements that emit light based on the driving current, the light emitting elements having an ohmic contact resistance at anodes and cathodes of the light emitting elements, a first sensing transistor that couples the light emitting elements to a sensing line in response to a sensing signal when a sensing operation for sensing the ohmic contact resistance of the light emitting elements is performed, and a second sensing transistor that decouples the light emitting elements from a second power supply voltage line in response to an inverted sensing signal when the sensing operation is performed, wherein the sensing signal is different from the scan signal, and wherein the sensing signal having a voltage level to turn the first sensing transistor do not overlap the scan signal having the voltage level.

In example embodiments, when the sensing operation is performed, the driving transistor may be turned on to apply a sensing voltage to the light emitting elements through the first power supply voltage line, a sensing current flowing through the light emitting elements based on the sensing voltage may be provided to the sensing line through the first sensing transistor, and the ohmic contact resistance of the light emitting elements may be sensed based on the sensing current provided to the sensing line.

In example embodiments, the light emitting elements may include an inorganic material.

In example embodiments, the light emitting assembly may further include an anode electrode coupled to the anodes of the light emitting elements, the anode electrode having a comb shape including comb teeth, and a cathode electrode coupled to the cathodes of the light emitting elements and spaced apart from the anode electrode, the cathode electrode having the comb shape including the comb teeth and being disposed symmetrically to the anode electrode.

In example embodiments, the light emitting elements may be disposed on regions between the comb teeth of the anode electrode and the comb teeth of the cathode electrode.

In example embodiments, the switching transistor may include a gate receiving the scan signal, a first terminal coupled to a data line, and a second terminal, the storage capacitor may include a first electrode coupled to the first power supply voltage line, and a second electrode coupled to the second terminal of the switching transistor, and the driving transistor may include a gate coupled to the second electrode of the storage capacitor, a first terminal coupled to the first power supply voltage line, and a second terminal.

In example embodiments, the light emitting elements may include the anodes coupled to the second terminal of the driving transistor, and the cathodes, the first sensing transistor may include a gate receiving the sensing signal, a first terminal coupled to the cathodes of the light emitting elements, and a second terminal coupled to the sensing line, and the second sensing transistor may include a gate receiving the inverted sensing signal, a first terminal coupled to the cathodes of the light emitting elements, and a second terminal coupled to the second power supply voltage line.

In example embodiments, the sensing line may be a same line as a data line for providing the data voltage.

In example embodiments, the sensing line may be different from a data line for providing the data voltage.

According to example embodiments, there is provided a light emitting assembly including a plurality of pixels, wherein each of the plurality of pixels includes: a switching transistor including a gate receiving a scan signal, a first terminal coupled to a data line, and a second terminal, a storage capacitor including a first electrode coupled to a first power supply voltage line, and a second terminal coupled to the second terminal of the switching transistor, a driving transistor including a gate coupled to the second electrode of the storage capacitor, a first terminal coupled to the first power supply voltage line, and a second terminal, a plurality of light emitting elements including an inorganic material, the light emitting elements having anodes coupled to the second terminal of the driving transistor, and cathodes, a first sensing transistor including a gate receiving a sensing signal, a first terminal coupled to the cathodes of the light emitting elements, and a second terminal coupled to a sensing line, and a second sensing transistor including a gate receiving an inverted sensing signal, a first terminal coupled to the cathodes of the light emitting elements, and a second terminal coupled to a second power supply voltage line, wherein the sensing signal is different from the scan signal, and wherein the sensing signal having a voltage level to turn the first sensing transistor do not overlap the scan signal having the voltage level.

In example embodiments, the light emitting assembly pixel may further include an anode electrode coupled between the second terminal of the driving transistor and the anodes of the light emitting elements, the anode electrode having a comb shape including comb teeth, and a cathode electrode coupled between the cathodes of the light emitting elements and the second power supply voltage line and spaced apart from the anode electrode, the cathode electrode having the comb shape including the comb teeth and being disposed symmetrically to the anode electrode.

According to example embodiments, there is provided a display device including: a plurality of pixels, each pixel including a plurality of light emitting elements, a sensing unit that senses an ohmic contact resistance of the light emitting elements of each pixel, and a driving unit that generates a data voltage where a deviation of the ohmic contact resistance between the plurality of light emitting assembly pixels is compensated, and that drives the plurality of pixels based on the data voltage where the deviation of the ohmic contact resistance is compensated, wherein each pixel comprises: a switching transistor that transfers the data voltage provided from the driving unit in response to a scan signal; a storage capacitor that stores the data voltage transferred by the switching transistor; a driving transistor coupled to a first power supply voltage line, and that generates a driving current based on the data voltage stored in the storage capacitor; the light emitting elements that emit light based on the driving current, the light emitting elements having the ohmic contact resistance at anodes and cathodes of the light emitting elements; a first sensing transistor that couples the light emitting elements to a sensing line in response to a sensing signal when a sensing operation for sensing the ohmic contact resistance of the light emitting elements is performed; and a second sensing transistor that decouples the light emitting elements from a second power supply voltage line in response to an inverted sensing signal when the sensing operation is performed, wherein the sensing signal is different from the scan signal, and wherein the sensing signal having a voltage level to turn the first sensing transistor do not overlap the scan signal having the voltage level.

In example embodiments, the light emitting elements may include an inorganic material.

In example embodiments, each pixel may include a switching transistor that transfers the data voltage provided from the driving unit in response to a scan signal, a storage capacitor that stores the data voltage transferred by the switching transistor, a driving transistor coupled to a first power supply voltage line, and that generates a driving current based on the data voltage stored in the storage capacitor, the light emitting elements that emit light based on the driving current, the light emitting elements having the ohmic contact resistance at anodes and cathodes of the light emitting elements, a first sensing transistor that couples the light emitting elements to a sensing line in response to a sensing signal when a sensing operation for sensing the ohmic contact resistance of the light emitting elements is performed, and a second sensing transistor that decouples the light emitting elements from a second power supply voltage line in response to an inverted sensing signal when the sensing operation is performed, wherein the sensing signal is different from the scan signal, and wherein the sensing signal having a voltage level to turn the first sensing transistor do not overlap the scan signal having the voltage level.

In example embodiments, each pixel may further include an anode electrode coupled to the anodes of the light emitting elements, the anode electrode having a comb shape including comb teeth, and a cathode electrode coupled to the cathodes of the light emitting elements and spaced apart from the anode electrode, the cathode electrode having the comb shape including the comb teeth and being disposed symmetrically (e.g., substantially symmetrically) to the anode electrode.

In example embodiments, the sensing unit may include a sensing circuit that receives a sensing current flowing through the light emitting elements based on a sensing voltage from each pixel, and to output values indicating the ohmic contact resistances for the plurality of pixels, and a pixel ohmic map memory that stores a pixel ohmic map including the values indicating the ohmic contact resistances for the plurality of pixels.

In example embodiments, the driving unit may include a data compensating unit that generates data compensation information based on the values indicating the ohmic contact resistances stored in the pixel ohmic map memory, and a pixel driving unit that generates the data voltage where the deviation of the ohmic contact resistance is compensated based on the data compensation information, and that provides the data voltage where the deviation of the ohmic contact resistance is compensated to the plurality of pixels.

In example embodiments, the driving unit may further include a nonvolatile memory configured that stores the data compensation information generated by the data compensating unit.

In example embodiments, the sensing unit may perform a sensing operation for sensing the ohmic contact resistance of the light emitting elements of each pixel once when the display device is manufactured.

In example embodiments, the sensing unit may periodically perform a sensing operation for sensing the ohmic contact resistance of the light emitting elements of each pixel while the display device operates.

As described above, the light emitting assembly and the display device may sense the ohmic contact resistances of the plurality of light emitting elements included in each pixel, thereby compensating for the ohmic contact resistance deviation between the light emitting assembly pixels.

BRIEF DESCRIPTION OF THE DRAWINGS

Illustrative, non-limiting example embodiments will be more clearly understood from the following detailed description in conjunction with the accompanying drawings.

FIG. 7 is a diagram illustrating an example of a pixel ohmic map include in a Q-NED display device according to example embodiments.

DETAILED DESCRIPTION

Hereinafter, embodiments of the subject matter of the present disclosure will be explained in more detail with reference to the accompanying drawings.

Figure 1:
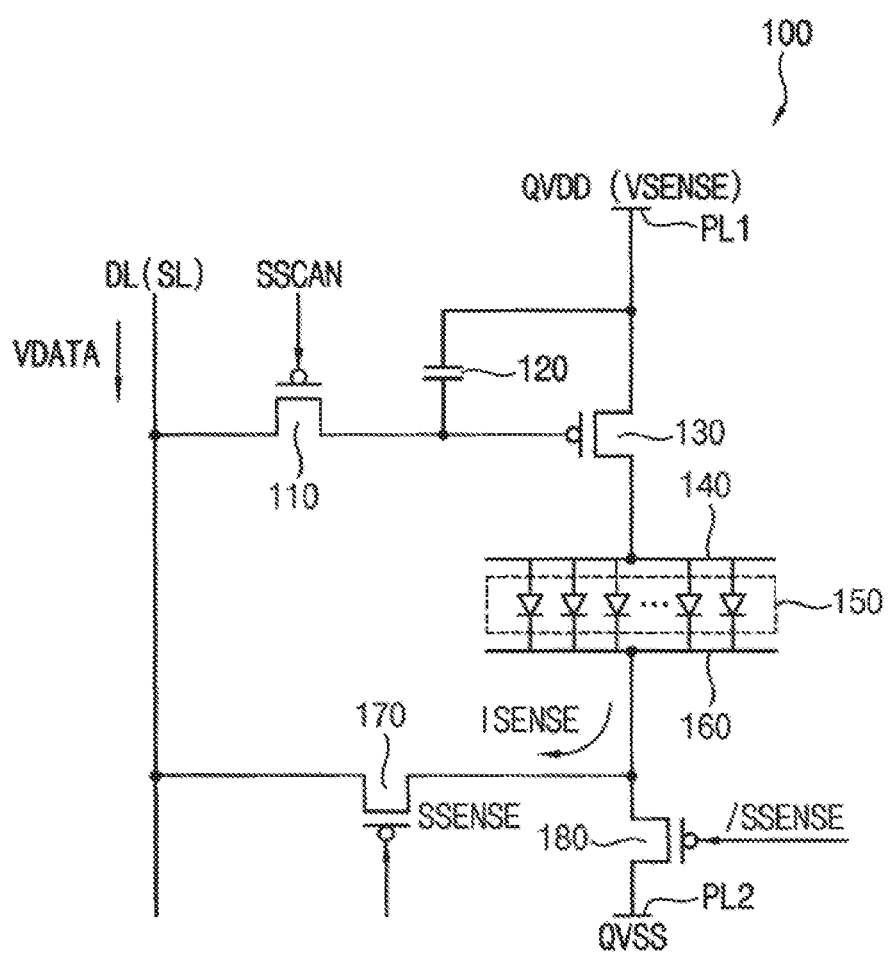
FIG. 1 is a circuit diagram illustrating a quantum-nano light emitting diode (Q-NED) pixel according to example embodiments.
Figure 2:
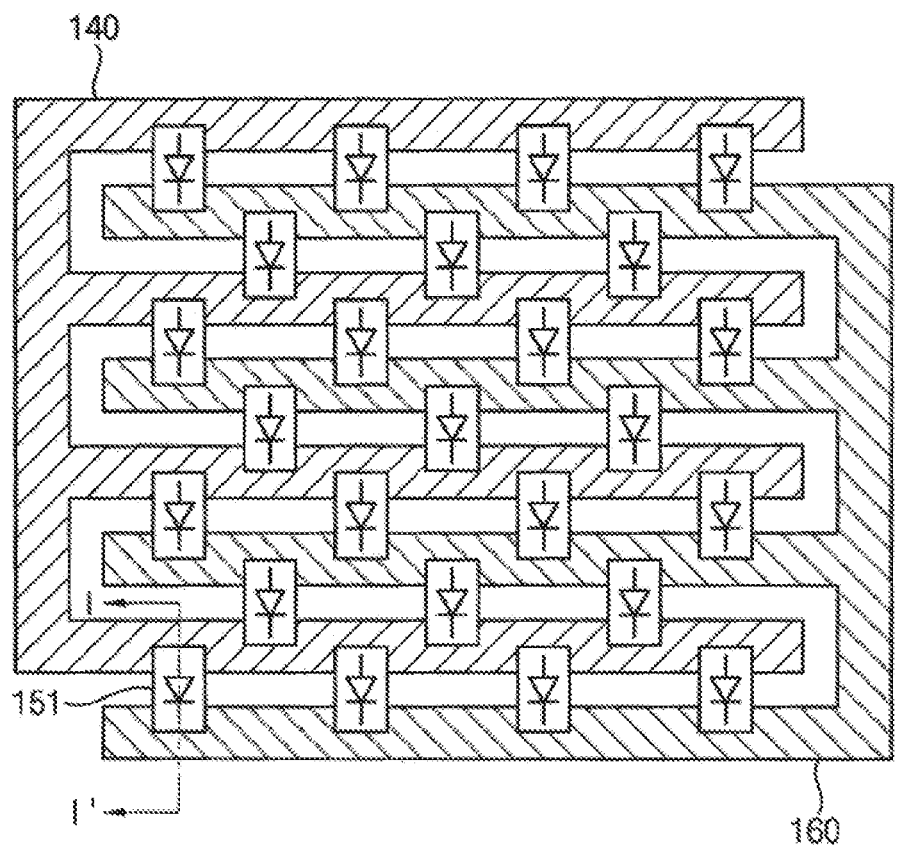
FIG. 2 is a plan view of an example of an arrangement of Q-NEDs included in a Q-NED pixel according to example embodiments.
Figure 3:
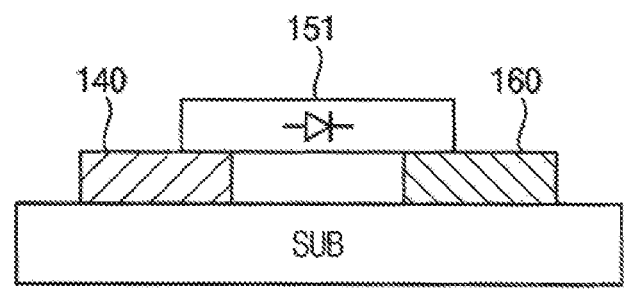
FIG. 3 is a cross-sectional view taken along the line I-I' of FIG. 2.

FIG. 1 is a circuit diagram illustrating a quantum-nano light emitting diode (Q-NED) pixel according to example embodiments, FIG. 2 is a plan view of an example of an arrangement of Q-NEDs included in a Q-NED pixel according to example embodiments, and FIG. 3 is a cross-sectional view taken along the line I-I' of FIG. 2.

Referring to FIG. 1, a Q-NED pixel 100 according to example embodiments may include a switching transistor 110, a storage capacitor 120, a driving transistor 130, a plurality of Q-NEDs 150, a first sensing transistor 170 and a second sensing transistor 180.

The switching transistor 110 may transfer a data voltage VDATA provided through a data line DL to the storage capacitor 120 in response to a scan signal SSCAN. The switching transistor 110 may include a gate receiving the scan signal SSCAN, a first terminal (e.g., a source terminal) coupled to (e.g., connected to) the data line DL, and a second terminal (e.g., a drain terminal) coupled to (e.g., connected to) the storage capacitor 120.

The storage capacitor 120 may store the data voltage VDATA transferred by the switching transistor 110. The storage capacitor 120 may include a first electrode coupled to (e.g., connected to) a first power supply voltage line PL1 for supplying a first power supply voltage (e.g., a high power supply voltage) QVDD, and a second electrode coupled to (e.g., connected to) the second terminal of the switching transistor 110.

The driving transistor 130 may be coupled to (e.g., connected to) the first power supply voltage line PL1, and may generate a driving current (e.g., corresponding to a difference between the data voltage VDATA and the first power supply voltage QVDD) based on the data voltage VDATA stored in the storage capacitor 120. The driving transistor 130 may include a gate coupled to (e.g., connected to) the second electrode of the storage capacitor 120, a first terminal coupled to (e.g., connected to) the first power supply voltage line PL1, and a second terminal coupled to (e.g., connected to) the plurality of Q-NEDs 150. In some example embodiments, luminance of light emitted by the Q-NED pixel 100 may be adjusted according to a voltage level of the applied data voltage VDATA in an analog driving method. In this case, the driving transistor 130 may operate in a saturation region. In other example embodiments, the luminance of light emitted by the Q-NED pixel 100 may be adjusted according to an emission time of the Q-NEDs 150 in a digital driving method. In this case, the driving transistor 130 may operate in a linear region.

The plurality of Q-NEDs 150 may emit light based on the driving current generated by the driving transistor 130. Unlike an organic light emitting diode (OLED) including an organic material, each Q-NED 150 may include an inorganic material. For example, each Q-NED 150 may include, but not limited to, gallium nitride (GaN) as the inorganic material.

In some example embodiments, the Q-NED pixel 100 may further include an anode electrode 140 coupled to (e.g., connected to) the first power supply voltage line PL1 through the driving transistor 130, and a cathode electrode 160 coupled to (e.g., connected to) a second power supply voltage line PL2 through a second sensing transistor 180. While an electric field is formed from the anode electrode 140 to the cathode electrode 160, the plurality of Q-NEDs 150 may be aligned such that anodes of the Q-NEDs 150 are coupled to (e.g., connected to) the anode electrode 140 and cathodes of the Q-NEDs 150 are coupled to (e.g., connected to) the cathode electrode 160. Accordingly, a current (e.g., the driving current) may flow from the anode electrode 140 through the plurality of Q-NEDs 150 to the cathode electrode 160, and the plurality of Q-NEDs 150 may emit light.

In some example embodiments, to increase the number of the Q-NEDs 150 disposed within each Q-NED pixel 100, each of the anode electrode 140 and the cathode electrode 160 may have a comb shape. For example, as illustrated in FIGS. 2 and 3, the anode electrode 140 coupled to (e.g., connected to) the anode of each Q-NED 151 may have the comb shape including a plurality of comb teeth. The cathode electrode 160 coupled to (e.g., connected to) the cathode of each Q-NED 151 may be spaced apart from the anode electrode 140, may have the comb shape including the plurality of comb teeth, and may be disposed symmetrically (e.g., substantially symmetrically) to the anode electrode 140. In this case, as illustrated in FIG. 3, each Q-NED 151 may be disposed on a region between one comb tooth of the anode electrode 140 and one comb tooth of cathode electrode 160, but the location of each Q-NED 151 may not be limited thereto. As shown in FIG. 3, the anode electrode 140 and the cathode electrode 160 may be on a substrate SUB. In some example embodiments, each Q-NED pixel 100 may include tens or hundreds of the Q-NEDs 150 according to a pixel size or pixels per inch (PPI), but the number of the Q-NEDs 150 in each Q-NED pixel 100 may not be limited thereto.

Each Q-NED 151 may have an ohmic contact resistance between its anode and the anode electrode 140 and between its cathode and the cathode electrode 160. For example, the plurality of Q-NEDs 150 included in each Q-NED pixel 100 may be considered to have ohmic contact resistors between their anodes and the anode electrode 140 and between their cathodes and the cathode electrode 160, and the ohmic contact resistors of the plurality of Q-NEDs 150 may be regarded to be coupled in (e.g., connected in) parallel. Here, the ohmic contact resistance of each Q-NED pixel 100, or the ohmic contact resistance of the plurality of Q-NEDs 150 included in each Q-NED pixel 100 may mean a total resistance of the parallel-coupled (e.g., parallel-connected) ohmic contact resistors of the plurality of Q-NEDs 150.

Figure 5:
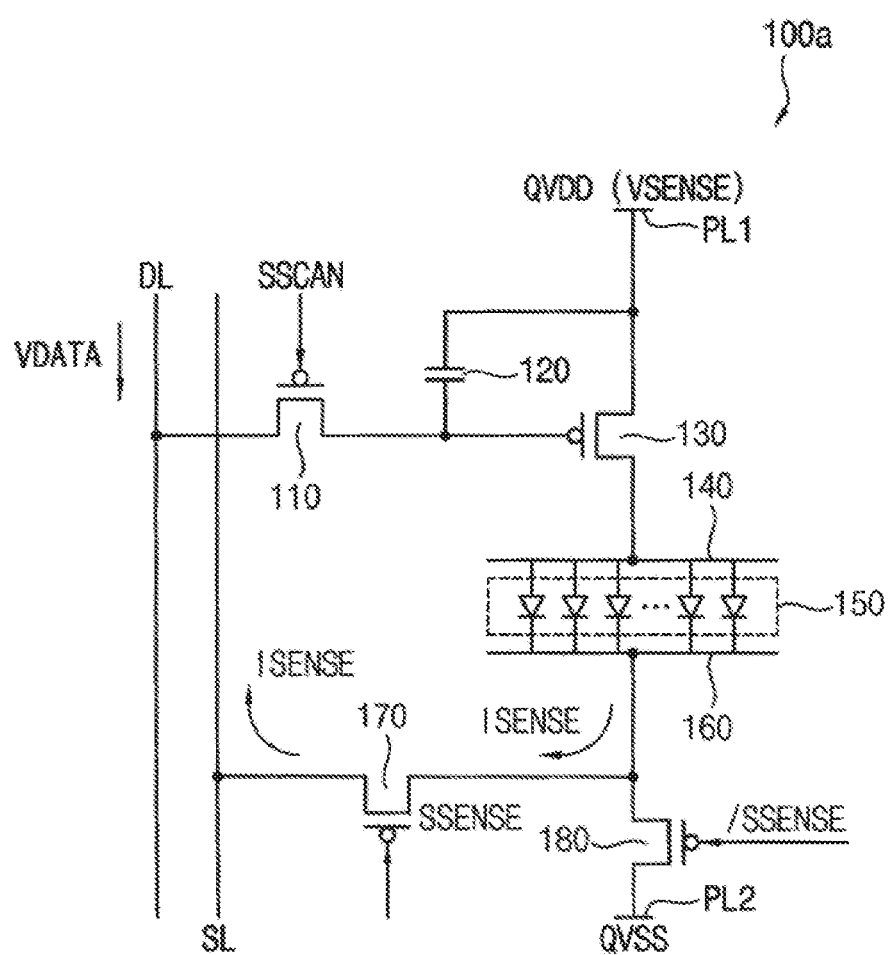
FIG. 5 is a circuit diagram illustrating a Q-NED pixel according to example embodiments.

The first sensing transistor 170 may couple (e.g., connect) the plurality of Q-NEDs 150 (or the cathode electrode 160 coupled to (e.g., connected to) the cathodes of the plurality of Q-NEDs 150) to a sensing line SL in response to a sensing signal SSENSE. The first sensing transistor 170 may include a gate receiving the sensing signal SSENSE, a first terminal coupled to (e.g., connected to) the cathodes (or the cathode electrode 160 coupled to (e.g., connected to) the cathodes) of the plurality of Q-NEDs 150, and a second terminal coupled to (e.g., connected to) the sensing line SL. In some example embodiments, as illustrated in FIG. 1, the data line DL for providing the data voltage VDATA may be used as the sensing line SL. In other example embodiments, as illustrated in FIG. 5, the sensing line SL may be separate from the data line DL.

The second sensing transistor 180 may decouple (e.g., disconnect) the plurality of Q-NEDs 150 from the second power supply voltage line PL2 for supplying a second power supply voltage (e.g., a low power supply voltage) QVSS in response to an inverted sensing signal /SSENSE that is an inversion signal of the sensing signal SSENSE. The second sensing transistor 180 may include a gate receiving the inverted sensing signal /SSENSE, a first terminal coupled to (e.g., connected to) the cathodes (or the cathode electrode 160 coupled to (e.g., connected to) the cathodes) of the plurality of Q-NEDs 150, and a second terminal coupled to (e.g., connected to) the second power supply voltage line PL2.

Each Q-NED pixel 100 has the ohmic contact resistance at the anodes and the cathodes of the plurality of Q-NEDs 150. In a Q-NED display device including the Q-NED pixel 100, the ohmic contact resistances of plurality of Q-NED pixels 100 may be different from each other. For example, an ohmic contact resistance deviation may exist between the ohmic contact resistances of plurality of Q-NED pixels 100. Although the same or substantially the same voltage data VDATA is applied to the plurality of Q-NED pixels 100, the plurality of Q-NED pixels 100 may emit light with different luminance because of the ohmic contact resistance deviation between the Q-NED pixels 100, which results in a mura defect in the Q-NED display device.

However, in a Q-NED display device including the Q-NED pixel 100 according to example embodiments, a sensing operation for sensing the ohmic contact resistance of each Q-NED pixel 100 may be performed. For example, to perform the sensing operation for sensing the ohmic contact resistance of each Q-NED pixel 100, a turn-on voltage may be provided as the data voltage VDATA to the data line DL, the switching transistor 110 may be turned on in response to the scan signal SSCAN to store the turn-on voltage in the storage capacitor 120, and the driving transistor 130 may be turned on based on the turn-on voltage stored in the storage capacitor 120. Further, a sensing voltage VSENSE may be provided to the first power supply voltage line PL1, and the sensing voltage VSENSE may be applied to the plurality of Q-NEDs 150 through the turned-on driving transistor 130. Then, a sensing current ISENSE flowing through the plurality of Q-NEDs 150 may be generated based on the sensing voltage VSENSE. Further, to provide the sensing current ISENSE flowing through the plurality of Q-NEDs 150 to the sensing line SL, the first sensing transistor 170 may be turned on in response to the sensing signal SSENSE to couple (e.g., connect) the plurality of Q-NEDs 150 to the sensing line SL, and the second sensing transistor 180 may be turned off in response to the inverted sensing signal /SSENSE to decouple (e.g., disconnect) the plurality of Q-NEDs 150 from the second power supply voltage line PL2. The ohmic contact resistance of the Q-NED pixel 100, or the ohmic contact resistance of the plurality of Q-NEDs 150 of the Q-NED pixel may be sensed based on the sensing current ISENSE provided to the sensing line SL. In this way, the ohmic contact resistances of the plurality of Q-NED pixels 100 included in the Q-NED display device may be sensed to compensate for the deviation of the ohmic contact resistances of the plurality of Q-NED pixels 100, and the plurality of Q-NED pixels 100 may be driven based on the data voltage VDATA where the ohmic contact resistance deviation is compensated, thereby preventing or reducing the mura defect caused by the ohmic contact resistance deviation in the Q-NED display device according to example embodiments.

As described above, the Q-NED pixel 100 according to example embodiments may include the plurality of Q-NEDs 150 including the inorganic material, and thus may maintain light emission efficiency over time. Further, the Q-NED pixel 100 according to example embodiments may include the first and second sensing transistors 170 and 180, thereby efficiently sensing the ohmic contact resistance of the plurality of Q-NEDs 150.

Figure 4:
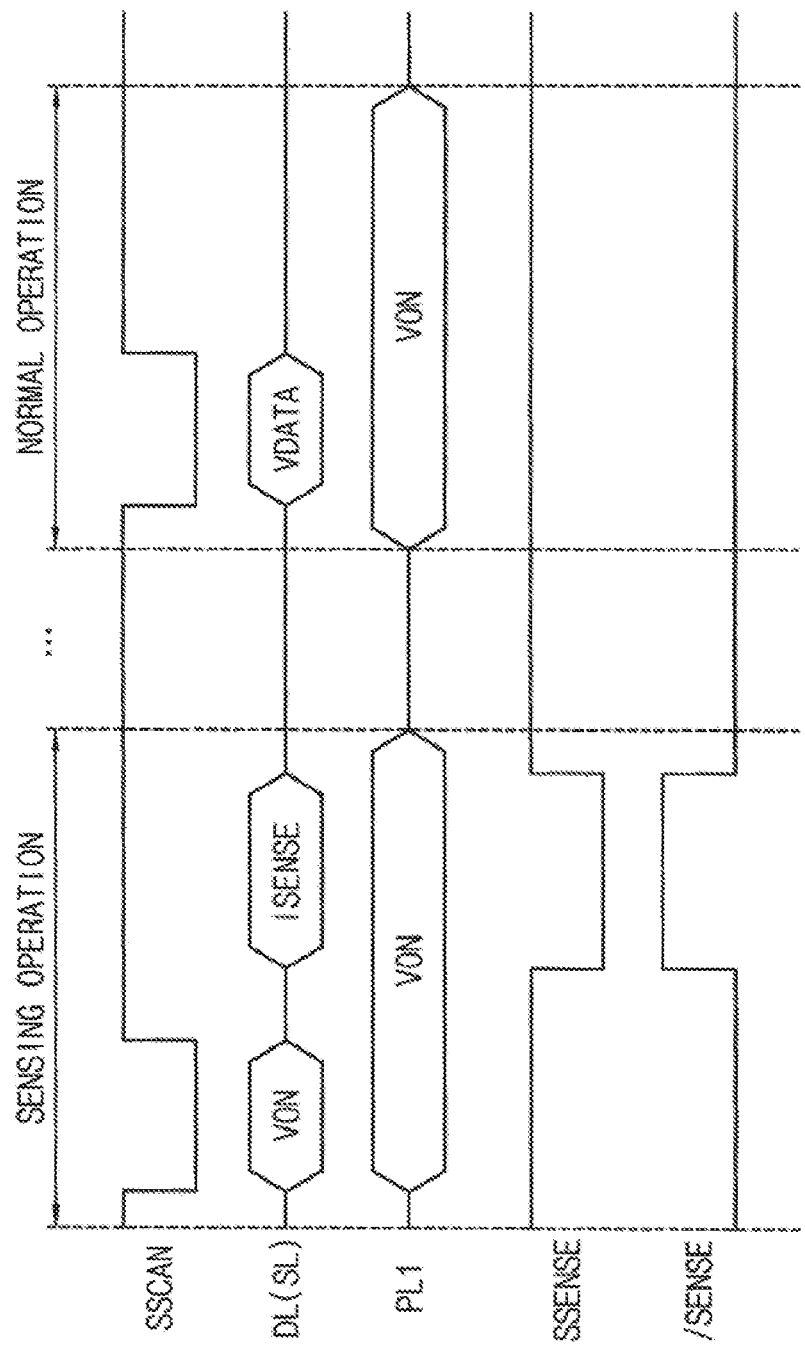
FIG. 4 is a timing diagram for describing an example of a sensing operation and a normal operation of a Q-NED pixel according to example embodiments.

FIG. 4 is a timing diagram for describing an example of a sensing operation and a normal operation of a Q-NED pixel according to example embodiments.

Referring to FIGS. 1 and 4, when a sensing operation for sensing an ohmic contact resistance of a plurality of Q-NEDs 150 included in a Q-NED pixel 100 is performed, a turn-on voltage VON may be provided to a data line DL, and a switching transistor 110 may be turned on in response to a scan signal SSCAN to store the turn-on voltage VON in a storage capacitor 120. A driving transistor 130 may be turned on based on the turn-on voltage VON stored in the storage capacitor 120. Thereafter, a first sensing transistor 170 may be turned on in response to a sensing signal SSENSE having a logic low level, and a second sensing transistor 180 may be turned off in response to an inverted sensing signal /SSENSE having a logic high level. A sensing voltage VSENSE having a set (e.g., predetermined) voltage level may be provided to a first power supply voltage line PL1. In some example embodiments, the sensing voltage VSENSE may have a voltage level the same or substantially the same as a voltage level of a first power supply voltage (e.g., a high power supply voltage) QVDD. In other example embodiments, the sensing voltage VSENSE may have a voltage level different from the voltage level of the first power supply voltage QVDD. For example, the sensing voltage VSENSE may correspond to a threshold voltage of the plurality of Q-NEDs 150 or a black voltage such that a lower or minimum current flows through the plurality of Q-NEDs 150, but the sensing voltage VSENSE may not be limited thereto. The sensing voltage VSENSE provided to the first power supply voltage line PL1 may be applied to the plurality of Q-NEDs 150 through the turned-on driving transistor 130, and a sensing current ISENSE flowing through the plurality of Q-NEDs 150 based on the sensing voltage VSENSE may be provided to a sensing line SL through the turned-on first sensing transistor 170. The ohmic contact resistance of the plurality of Q-NEDs 150 included in the Q-NED pixel 100 may be sensed based on the sensing current ISENSE provided to the sensing line SL. In this way, the ohmic contact resistances of a plurality of Q-NED pixels 100 included in a Q-NED display device may be sensed to compensate for an ohmic contact resistance deviation of the plurality of Q-NED pixels 100, and a data voltage VDATA where the ohmic contact resistance deviation is compensated may be generated based on the sensed ohmic contact resistances.

Thereafter, when a normal operation for displaying an image is performed, the data voltage VDATA provided to the plurality of Q-NED pixels 100 through the data line DL may be a voltage where the deviation of the ohmic contact resistances of the plurality of Q-NED pixels 100 is compensated. For example, the data voltage VDATA may be adjusted to compensate for the deviation of the ohmic contact resistances sensed during the sensing operation. For example, the data voltage VDATA for the Q-NED pixel 100 having a relatively high ohmic contact resistance may be adjusted such that a gate-source voltage of the driving transistor 130 has a relatively high absolute value, and the data voltage VDATA for the Q-NED pixel 100 having a relatively low ohmic contact resistance may be adjusted such that a gate-source voltage of the driving transistor 130 has a relatively low absolute value. Accordingly, in the Q-NED display device including the Q-NED pixel 100 according to example embodiments, a mura defect caused by the ohmic contact resistance deviation between the plurality of Q-NED pixels 100 may be prevented or reduced.

FIG. 5 is a circuit diagram illustrating a Q-NED pixel according to example embodiments.

A Q-NED pixel 100a of FIG. 5 may have substantially the same configuration and operation as a Q-NED pixel 100 of FIG. 1, except that a data line DL and a sensing line SL are separate lines. The Q-NED pixel 100a of FIG. 5 may receive a data voltage VDATA through the data line DL, and may output a sensing current ISENSE through the sensing line SL different from the data line DL FIG. 6 is a block diagram illustrating a Q-NED display device according to example embodiments, and FIG. 7 is a diagram illustrating an example of a pixel ohmic map include in a Q-NED display device according to example embodiments.

Figure 6:
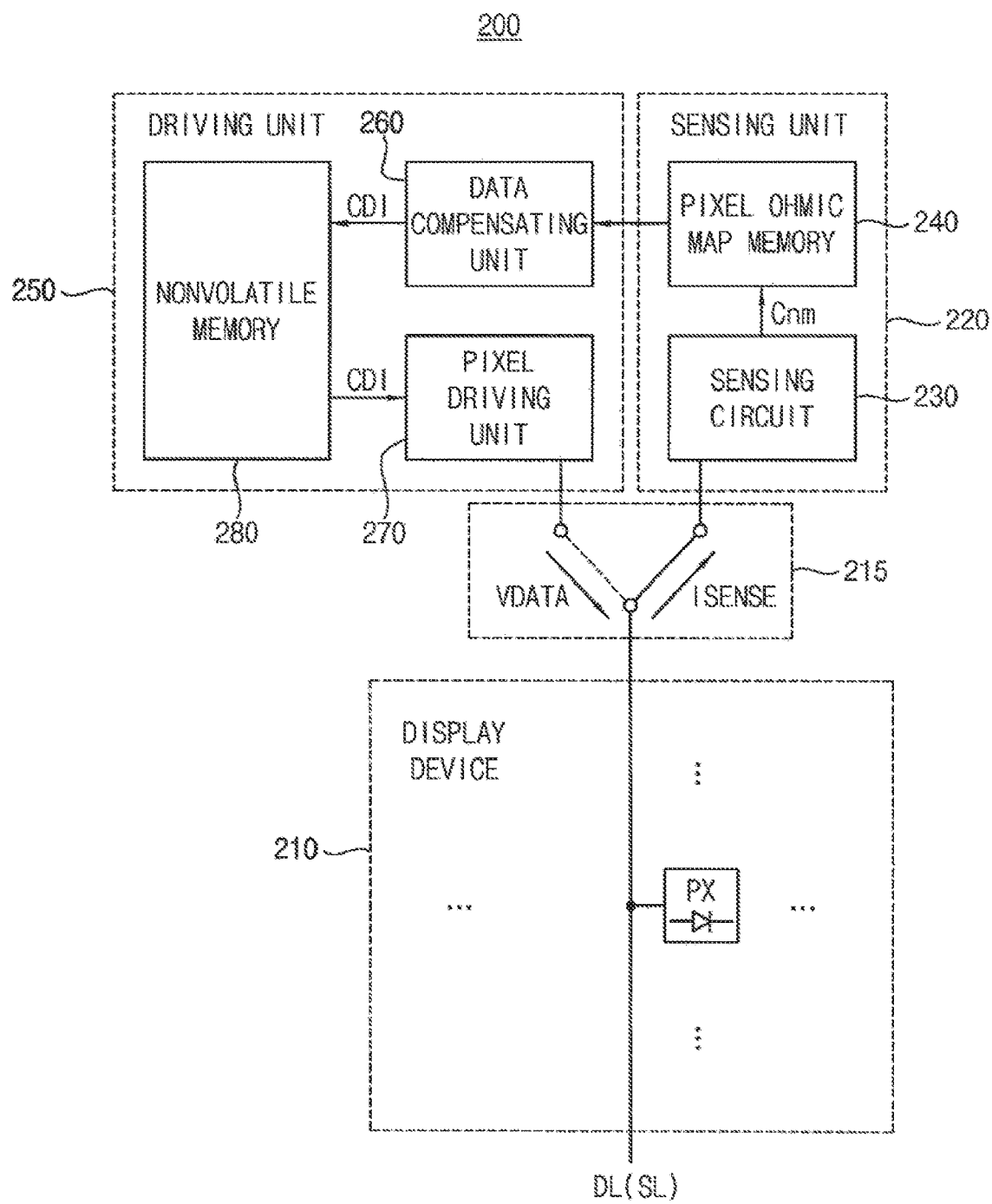
FIG. 6 is a block diagram illustrating a Q-NED display device according to example embodiments.

Referring to FIG. 6, a Q-NED display device 200 according to example embodiments may include a display panel 210 including a plurality of Q-NED pixels PX, a sensing unit 220 that senses an ohmic contact resistance of Q-NEDs 150 of each Q-NED pixel PX, and a driving unit 250 that generates a data voltage VDATA where a deviation of the ohmic contact resistance between the plurality of Q-NED pixels PX is compensated, and that drives the plurality of Q-NED pixels PX based on the data voltage VDATA where the deviation of the ohmic contact resistance is compensated. In some example embodiments, the data line DL and the sensing line SL are the same line, and the Q-NED display device 200 may further include a switching unit 215 that selectively couples (e.g., connects) the data line DL (or the sensing line SL) to the driving unit 250 or the sensing unit 220.

The display panel 210 may include the plurality of Q-NED pixels PX that are arranged in a matrix form having a plurality of rows (e.g., n rows) and a plurality of columns (e.g., m rows). Each Q-NED pixel PX may include the plurality of Q-NEDs 150. The plurality of Q-NEDs 150 may include an inorganic material, and may not be degraded over time. The plurality of Q-NEDs 150 in each Q-NED pixel PX may have an ohmic contact resistance at their anodes and cathodes, and the plurality of Q-NED pixels PX may have different ohmic contact resistances because of tilt or contact interface non-uniformity of the Q-NEDs 150.

The sensing unit 220 may receive a sensing current ISENSE from each Q-NED pixel PX to sense the ohmic contact resistance of each Q-NED pixel PX. In some example embodiments, the sensing unit 220 may include a sensing circuit 230 that receives the sensing current ISENSE flowing through the Q-NEDs 150 based on a sensing voltage from each Q-NED pixel PX and that generates and outputs a value Cnm indicating the ohmic contact resistance for each Q-NED pixel PX based on the sensing current ISENSE, and a pixel ohmic map memory 240 that stores a pixel ohmic map including the values Cnm indicating the ohmic contact resistances for the plurality of Q-NED pixels PX that are output from the sensing circuit 230.

In an example, the sensing circuit 230 may calculate the ohmic contact resistance of each Q-NED pixel PX based on the sensing current ISENSE from the Q-NED pixel PX, and may output, as the value Cnm indicating the ohmic contact resistance, the calculated ohmic contact resistance of the Q-NED pixel PX divided by a reference ohmic contact resistance. The pixel ohmic map memory 240 may receive the value Cnm indicating the ohmic contact resistance output from the sensing circuit 230, and may store the value Cnm in the pixel ohmic map. For example, as illustrated in FIG. 7, the pixel ohmic map 245 stored in the pixel ohmic map memory 240 may have n rows having the same or substantially the same number as the n rows of the plurality of Q-NED pixels PX of the display panel 210, may have n columns having the same or substantially the same number as the m columns of the plurality of Q-NED pixels PX of the display panel 210, and may have n*m entities in one-to-one correspondence with the plurality of Q-NED pixels PX, where n and m may be integer greater than 1. The pixel ohmic map 245 may include values C11, C12, C1m, C21, Cn1, Cn2 and Cnm calculated by dividing measured ohmic contact resistances R11, R12, R1m, R21, Rn1, Rn2 and Rnm of the Q-NED pixels PX by the reference ohmic contact resistance RREF at corresponding entities.

The driving unit 250 may drive the plurality of Q-NED pixels PX such that the ohmic contact resistance deviation is compensated based on the values Cnm indicating the ohmic contact resistances for the plurality of Q-NED pixels PX provided from the sensing unit 220. In some example embodiments, the driving unit 250 may include a data compensating unit 260 that generates data compensation information CDI based on the values Cnm indicating the ohmic contact resistances of the plurality of Q-NED pixels PX stored in the pixel ohmic map memory 240, and a pixel driving unit 270 that generates the data voltage VDATA where the deviation of the ohmic contact resistance is compensated based on the data compensation information CDI and provides the data voltage VDATA where the deviation of the ohmic contact resistance is compensated to the plurality of Q-NED pixels PX. Further, in some example embodiments, the driving unit 250 may further include a nonvolatile memory 280 that stores the data compensation information CDI generated by the data compensating unit 260.

In some example embodiments, the sensing unit 220 may perform a sensing operation for sensing the ohmic contact resistance of the Q-NEDs 150 of each Q-NED pixel PX once when the Q-NED display device 200 is manufactured. The data compensation information CDI generated by the sensing operation may be stored in the nonvolatile memory 280, and, when a normal operation for displaying an image is performed, the plurality of Q-NED pixels PX may be driven based on the data voltage VDATA where the ohmic contact resistance deviation is compensated based on the stored data compensation information CDI. Accordingly, a mura defect caused by the ohmic contact resistance deviation between the plurality of Q-NED pixels PX may be prevented or reduced. In other example embodiments, the sensing unit 220 may periodically perform the sensing operation for sensing the ohmic contact resistance of the Q-NEDs 150 of each Q-NED pixel PX while the Q-NED display device 200 operates.

Figure 8:
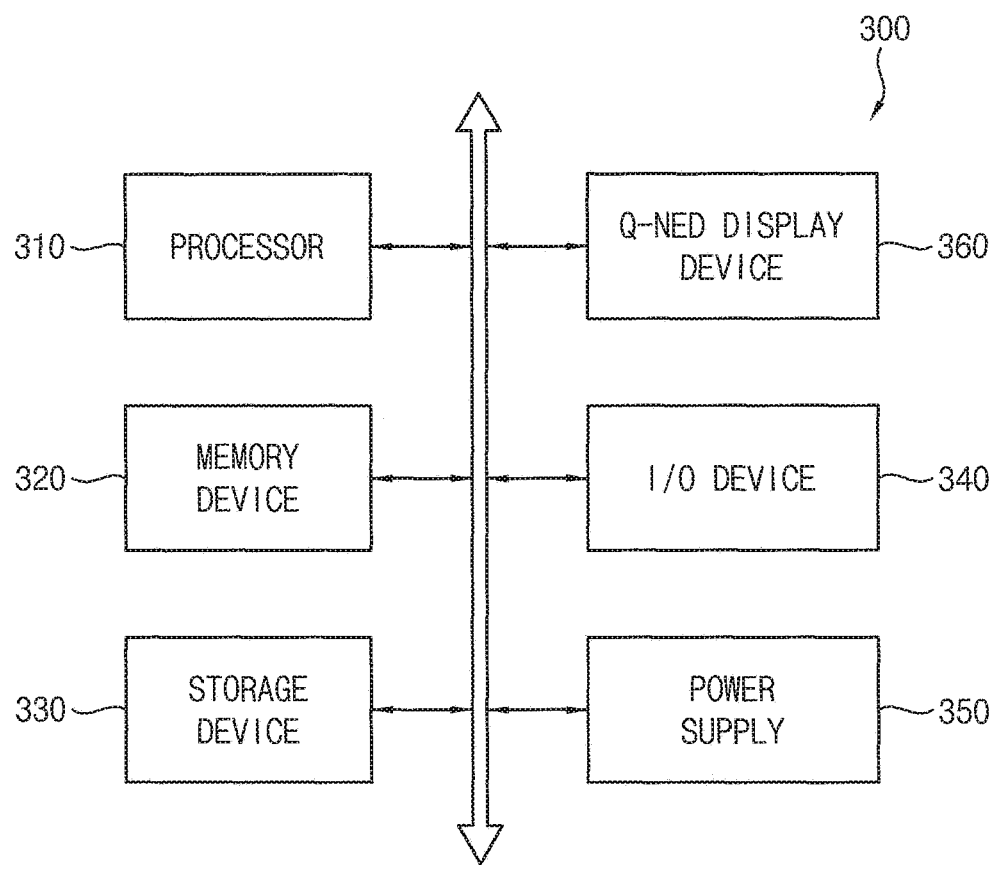
FIG. 8 is a block diagram illustrating an electronic device including a Q-NED display device according to example embodiments.

FIG. 8 is a block diagram illustrating an electronic device including a Q-NED display device according to example embodiments.

Referring to FIG. 8, an electronic device 300 may include a processor 310, a memory device 320, a storage device 330, an input/output (I/O) device 340, a power supply 350 and a Q-NED display device 360. The electronic device 300 may further include a plurality of ports for communicating a video card, a sound card, a memory card, a universal serial bus (USB) device, other electronic devices, etc.

The processor 310 may perform various computing functions or tasks. In some example embodiments, processor 310 may be an application processor (AP), a central processing unit (CPU), a graphics processing unit (GPU), a micro processor, etc. The processor 310 may be coupled to other components via an address bus, a control bus, a data bus, etc. Further, the processor 310 may be coupled to an extended bus such as a peripheral component interconnection (PCI) bus.

The memory device 320 may store data for operations of the electronic device 300. For example, the memory device 320 may include at least one nonvolatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc.

The storage device 330 may be a solid state drive (SSD) device, a hard disk drive (HDD) device, a CD-ROM device, etc. The I/O device 340 may be an input device such as a keyboard, a keypad, a mouse device, a touchpad, a touchscreen, a remote controller, etc, and an output device such as a printer, a speaker, etc. The power supply 350 may provide power for operations of the electronic device 300. The Q-NED display device 360 may be coupled to other components via the buses or other communication links.

The Q-NED display device 360 may include a plurality of Q-NED including an inorganic material at each Q-NED pixel. Further, the Q-NED display device 360 may sense ohmic contact resistances of respective Q-NED pixels, and may drive the Q-NED pixels such that a deviation of the ohmic contact resistances is compensated based on the sensed ohmic contact resistances. Accordingly, the Q-NED display device 360 may prevent or reduce a mura defect caused by the ohmic contact resistance deviation between the Q-NED pixels.

In some example embodiments, the electronic device 300 may be a portable electronic device, such as a smart phone, a mobile phone, a tablet computer, etc. In some example embodiments, the electronic device 300 may be any suitable electronic device including the Q-NED display device 360, such as a digital television (TV), a 3D TV, a personal computer (PC), a home appliance, a laptop computer, a personal digital assistant (PDA), a portable multimedia player (PMP), a digital camera, a music player, a portable game console, a navigation device, etc.

Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The foregoing is illustrative of example embodiments and is not to be construed as limiting thereof. Although a few example embodiments have been described, those skilled in the art will readily appreciate that many modifications are possible in the example embodiments without materially departing from the novel features of the subject matter of the present disclosure. Accordingly, all such modifications are intended to be included within the scope of the present disclosure as defined in the claims, and equivalents thereof. Therefore, it is to be understood that the foregoing is illustrative of various example embodiments and is not to be construed as limited to the specific example embodiments disclosed herein, and that modifications to the disclosed example embodiments, as well as other example embodiments, are intended to be included within the scope of the appended claims, and equivalents thereof.

What is claimed is:

1. A light emitting assembly comprising:
 a plurality of pixels, wherein each of the plurality of pixels comprises:
 a switching transistor that transfers a data voltage in response to a scan signal;
 a storage capacitor that stores the data voltage transferred by the switching transistor;
 a driving transistor coupled to a first power supply voltage line, and that generates a driving current based on the data voltage stored in the storage capacitor;
 a plurality of light emitting elements that emit light based on the driving current, the light emitting elements having an ohmic contact resistance at anodes and cathodes of the light emitting elements;
 a first sensing transistor that couples the light emitting elements to a sensing line in response to a sensing signal when a sensing operation for sensing the ohmic contact resistance of the light emitting elements is performed; and
 a second sensing transistor that decouples the light emitting elements from a second power supply voltage line in response to an inverted sensing signal when the sensing operation is performed,
 wherein the sensing signal is different from the scan signal, and
 wherein the sensing signal having a voltage level to turn the first sensing transistor do not overlap the scan signal having the voltage level.

2. The light emitting assembly pixel of claim 1, wherein, when the sensing operation is performed,
 the driving transistor is turned on to apply a sensing voltage to the light emitting elements through the first power supply voltage line,
 a sensing current flowing through the light emitting elements based on the sensing voltage is provided to the sensing line through the first sensing transistor, and
 the ohmic contact resistance of the light emitting elements is sensed based on the sensing current provided to the sensing line.

3. The light emitting assembly pixel of claim 1, wherein the light emitting assembly comprise an inorganic material.

4. The light emitting assembly pixel of claim 1, further comprising:

an anode electrode coupled to the anodes of the light emitting elements, the anode electrode having a comb shape comprising comb teeth; and
 a cathode electrode coupled to the cathodes of the light emitting elements and spaced apart from the anode electrode, the cathode electrode having the comb shape comprising the comb teeth and being disposed symmetrically to the anode electrode.

5. The light emitting assembly of claim 4, wherein the light emitting elements are disposed on regions between the comb teeth of the anode electrode and the comb teeth of the cathode electrode.

6. The light emitting assembly of claim 1, wherein the switching transistor comprises a gate receiving the scan signal, a first terminal coupled to a data line, and a second terminal,
 wherein the storage capacitor comprises a first electrode coupled to the first power supply voltage line, and a second electrode coupled to the second terminal of the switching transistor, and
 wherein the driving transistor comprises a gate coupled to the second electrode of the storage capacitor, a first terminal coupled to the first power supply voltage line, and a second terminal.

7. The light emitting assembly of claim 6, wherein the light emitting elements comprise the anodes coupled to the second terminal of the driving transistor, and the cathodes,
 wherein the first sensing transistor comprises a gate receiving the sensing signal, a first terminal coupled to the cathodes of the light emitting elements, and a second terminal coupled to the sensing line, and
 wherein the second sensing transistor comprises a gate receiving the inverted sensing signal, a first terminal coupled to the cathodes of the light emitting elements, and a second terminal coupled to the second power supply voltage line.

8. The light emitting assembly of claim 1, wherein the sensing line is a same line as a data line for providing the data voltage.

9. The light emitting assembly of claim 1, wherein the sensing line is different from a data line for providing the data voltage.

10. A light emitting assembly comprising:
 a plurality of pixels, wherein each of the plurality of pixels comprises:
 a switching transistor comprising a gate receiving a scan signal, a first terminal coupled to a data line, and a second terminal;
 a storage capacitor comprising a first electrode coupled to a first power supply voltage line, and a second terminal coupled to the second terminal of the switching transistor;
 a driving transistor comprising a gate coupled to a second electrode of the storage capacitor, a first terminal coupled to the first power supply voltage line, and a second terminal;
 a plurality of light emitting elements comprising an inorganic material, the light emitting elements having anodes coupled to the second terminal of the driving transistor, and cathodes;
 a first sensing transistor comprising a gate receiving a sensing signal, a first terminal coupled to the cathodes of the light emitting elements, and a second terminal coupled to a sensing line; and
 a second sensing transistor comprising a gate receiving an inverted sensing signal, a first terminal coupled to the cathodes of the light emitting elements, and a second terminal coupled to a second power supply voltage line, wherein the sensing signal is different from the scan signal, and wherein the sensing signal having a voltage level to turn the first sensing transistor do not overlap the scan signal having the voltage level.

11. The light emitting assembly of claim 10, further comprising:

an anode electrode coupled between the second terminal of the driving transistor and the anodes of the light emitting elements, the anode electrode having a comb shape comprising comb teeth; and a cathode electrode coupled between the cathodes of the light emitting elements and the second power supply voltage line and spaced apart from the anode electrode, the cathode electrode having the comb shape comprising the comb teeth and being disposed symmetrically to the anode electrode.

12. A display device comprising:

a plurality of pixels, each pixel comprising a plurality of light emitting elements;

a sensing unit that senses an ohmic contact resistance of the light emitting elements of each pixel; and a driving unit that generates a data voltage where a deviation of the ohmic contact resistance between the plurality of pixels is compensated, and that drives the plurality of pixels based on the data voltage where the deviation of the ohmic contact resistance is compensated, wherein each pixel comprises:

a switching transistor that transfers the data voltage provided from the driving unit in response to a scan signal;

a storage capacitor that stores the data voltage transferred by the switching transistor;

a driving transistor coupled to a first power supply voltage line, and that generates a driving current based on the data voltage stored in the storage capacitor;

the light emitting elements that emit light based on the driving current, the light emitting elements having the ohmic contact resistance at anodes and cathodes of the light emitting elements;

a first sensing transistor that couples the light emitting elements to a sensing line in response to a sensing signal when a sensing operation for sensing the ohmic contact resistance of the light emitting elements is performed; and a second sensing transistor that decouples the light emitting elements from a second power supply voltage line in response to an inverted sensing signal when the sensing operation is performed, wherein the sensing signal is different from the scan signal, and wherein the sensing signal having a voltage level to turn the first sensing transistor do not overlap the scan signal having the voltage level.

13. The display device of claim 12, wherein the light emitting elements comprise an inorganic material.

14. The display device of claim 12, wherein each pixel further comprises:

an anode electrode coupled to the anodes of the light emitting elements, the anode electrode having a comb shape comprising comb teeth; and a cathode electrode coupled to the cathodes of the light emitting elements and spaced apart from the anode electrode, the cathode electrode having the comb shape comprising the comb teeth and being disposed symmetrically to the anode electrode.

15. The display device of claim 12, wherein the sensing unit comprises:

a sensing circuit that receives a sensing current flowing through the light emitting elements based on a sensing voltage from each pixel, and to output values indicating the ohmic contact resistances for the plurality of pixels; and a pixel ohmic map memory that stores a pixel ohmic map comprising the values indicating the ohmic contact resistances for the plurality of pixels.

16. The display device of claim 15, wherein the driving unit comprises:

a data compensating unit that generates data compensation information based on the values indicating the ohmic contact resistances stored in the pixel ohmic map memory; and a pixel driving unit that generates the data voltage where the deviation of the ohmic contact resistance is compensated based on the data compensation information, and that provides the data voltage where the deviation of the ohmic contact resistance is compensated to the plurality of pixels.

17. The display device of claim 16, wherein the driving unit further comprises:

a nonvolatile memory that stores the data compensation information generated by the data compensating unit.

18. The display device of claim 12, wherein the sensing unit performs a sensing operation for sensing the ohmic contact resistance of the light emitting elements of each pixel once when the device is manufactured.

19. The display device of claim 12, wherein the sensing unit periodically performs a sensing operation for sensing the ohmic contact resistance of the light emitting elements of each pixel while the display device operates.

* * * * *